(12) United States Patent
Mathew et al.

(10) Patent No.: US 12,449,327 B2
(45) Date of Patent: Oct. 21, 2025

(54) METHOD AND APPARATUS FOR LAMP HOUSING CRACK DETECTION

(71) Applicant: Applied Materials, Inc., Santa Clara, CA (US)

(72) Inventors: Philip Mathew, Milpitas, CA (US); Mehran Behdjat, San Jose, CA (US); Masamori Sanaka, Yachiyo (JP); Koji Nakanishi, Tokyo (JP); Ryan Murdoch, Grenoble (FR); Mark David Johnson, Orem, UT (US); Jun Qian, Sherwood, OR (US); Yuchun Chang, Cupertino, CA (US); George Govel, Schenectady, NY (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 338 days.

(21) Appl. No.: 17/867,944

(22) Filed: Jul. 19, 2022

(65) Prior Publication Data

US 2024/0027295 A1 Jan. 25, 2024

(51) Int. Cl.
*G01M 3/02* (2006.01)
*H05B 3/00* (2006.01)
*F27B 17/00* (2006.01)

(52) U.S. Cl.
CPC ............ *G01M 3/02* (2013.01); *H05B 3/0047* (2013.01); *F27B 17/0025* (2013.01)

(58) Field of Classification Search
CPC .............................. G01M 3/02; F27B 17/0025
USPC ........................................................... 73/40
See application file for complete search history.

(56) References Cited

U.S. PATENT DOCUMENTS

| 5,446,378 | A | * | 8/1995 | Reich | ............... G01N 21/21 324/225 |
| 6,157,429 | A | * | 12/2000 | Miyawaki | ......... G02F 1/136277 349/149 |
| 8,377,744 | B2 | | 2/2013 | Yamazaki et al. | |
| 2002/0086260 | A1 | | 7/2002 | Shang et al. | |
| 2004/0018751 | A1 | * | 1/2004 | Kusuda | ............. H01L 21/67115 438/795 |

(Continued)

FOREIGN PATENT DOCUMENTS

| WO | WO 2010-014384 A1 | 2/2010 | |
| WO | WO-2015098345 A1 * | 7/2015 | ........... B08B 7/0057 |

OTHER PUBLICATIONS

Light Irradiation Device (Translation for WO-2015098345-A1) (Year: 2015).*

(Continued)

*Primary Examiner* — Peter J Macchiarolo
*Assistant Examiner* — Rodney T Frank
(74) *Attorney, Agent, or Firm* — Moser Taboada

(57) ABSTRACT

Methods and apparatus for lamp housing crack detection are provided herein. For example, a method associated with a process chamber having a lamp housing comprises sequentially processing a plurality of substrates in the process chamber, during processing of the plurality of substrates, collecting lamp housing data indicative of a fluid leak in the lamp housing from a sensor operably connected to the lamp housing of the process chamber, determining from the lamp housing data whether lamp housing crack is present, and responsive to determining lamp housing crack is present, at least one of triggering an alert or stopping processing of the process chamber.

20 Claims, 3 Drawing Sheets

(56) References Cited

U.S. PATENT DOCUMENTS

| | | | |
|---|---|---|---|
| 2008/0280453 A1* | 11/2008 | Koelmel | H01L 21/67115 |
| | | | 438/758 |
| 2012/0270168 A1* | 10/2012 | Ranish | F27B 17/0025 |
| | | | 432/29 |
| 2015/0041453 A1* | 2/2015 | Vellore | H01L 21/67115 |
| | | | 219/446.1 |
| 2015/0179425 A1* | 6/2015 | Ranish | H01K 1/36 |
| | | | 439/271 |
| 2015/0206741 A1 | 7/2015 | Chang | |
| 2015/0348809 A1* | 12/2015 | Iu | H01R 33/09 |
| | | | 392/416 |
| 2016/0111306 A1* | 4/2016 | Ranish | H05B 3/0047 |
| | | | 392/419 |
| 2017/0105249 A1* | 4/2017 | Ranish | H05B 3/0047 |
| 2017/0345693 A1* | 11/2017 | Vellore | H01L 21/67248 |
| 2021/0005478 A1 | 1/2021 | Sanchez | |
| 2021/0220949 A1 | 7/2021 | Moffatt et al. | |

OTHER PUBLICATIONS

International Search Report for PCT/US2023/025922, dated Oct. 11, 2023.

* cited by examiner

METHOD AND APPARATUS FOR LAMP HOUSING CRACK DETECTION

FIELD

Embodiments of the disclosure generally relate to methods and apparatus for processing substrates, and for example, to methods and apparatus for lamp housing crack detection.

BACKGROUND

Using radiation heat sources for substrate processing is known. For example, reduced pressure chambers and atmospheric chambers can comprise a lamp housing that includes one or more lamps configured to heat one or more substrates to relatively high temperatures (e.g., for anneal processes, removal of oxidation, etc.). After extended use, however, the lamp housing (and/or the one or more lamps) can develop cracks (see FIG. 1 below). A cracked lamp housing can leak cooling water into a lamp tube of a lamp and/or onto a quartz window through which light can be radiated through. As result thereof, the process chamber will require relatively long unscheduled downtime and corrective maintenance to replace the lamp housing, clean the water leak, and address additional failures of the lamp and/or related components from water intrusion.

Therefore, the inventors describe herein improved methods and apparatus for lamp housing crack detection.

SUMMARY

Methods and apparatus for lamp housing crack detection are provided herein. In some embodiments, a method associated with a process chamber having a lamp housing comprises sequentially processing a plurality of substrates in the process chamber, during processing of the plurality of substrates, collecting lamp housing data indicative of a fluid leak in the lamp housing from a sensor operably connected to the lamp housing of the process chamber, determining from the lamp housing data whether lamp housing crack is present, and responsive to determining lamp housing crack is present, at least one of triggering an alert or stopping processing of the process chamber.

In at least some embodiments, a non-transitory computer readable storage medium has instructions stored thereon that when executed by a process perform a method of using a lamp housing processing a substrate. The method comprises sequentially processing a plurality of substrates in the process chamber, during processing of the plurality of substrates, collecting lamp housing data indicative of a fluid leak in the lamp housing from a sensor operably connected to the lamp housing of the process chamber, determining from the lamp housing data whether lamp housing crack is present, and responsive to determining lamp housing crack is present, at least one of triggering an alert or stopping processing of the process chamber.

In at least some embodiments, an apparatus for processing a substrate comprises a process chamber configured to use radiant heat provided by a lamp housing for processing a substrate, a sensor operably connected to the lamp housing, and a controller configured to sequentially process a plurality of substrates in the process chamber, during processing of the plurality of substrates, collect lamp housing data indicative of a fluid leak in the lamp housing from the sensor operably connected to the lamp housing of the process chamber, determine from the lamp housing data whether lamp housing crack is present, and responsive to determining lamp housing crack is present, at least one of trigger an alert or stop processing of the process chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
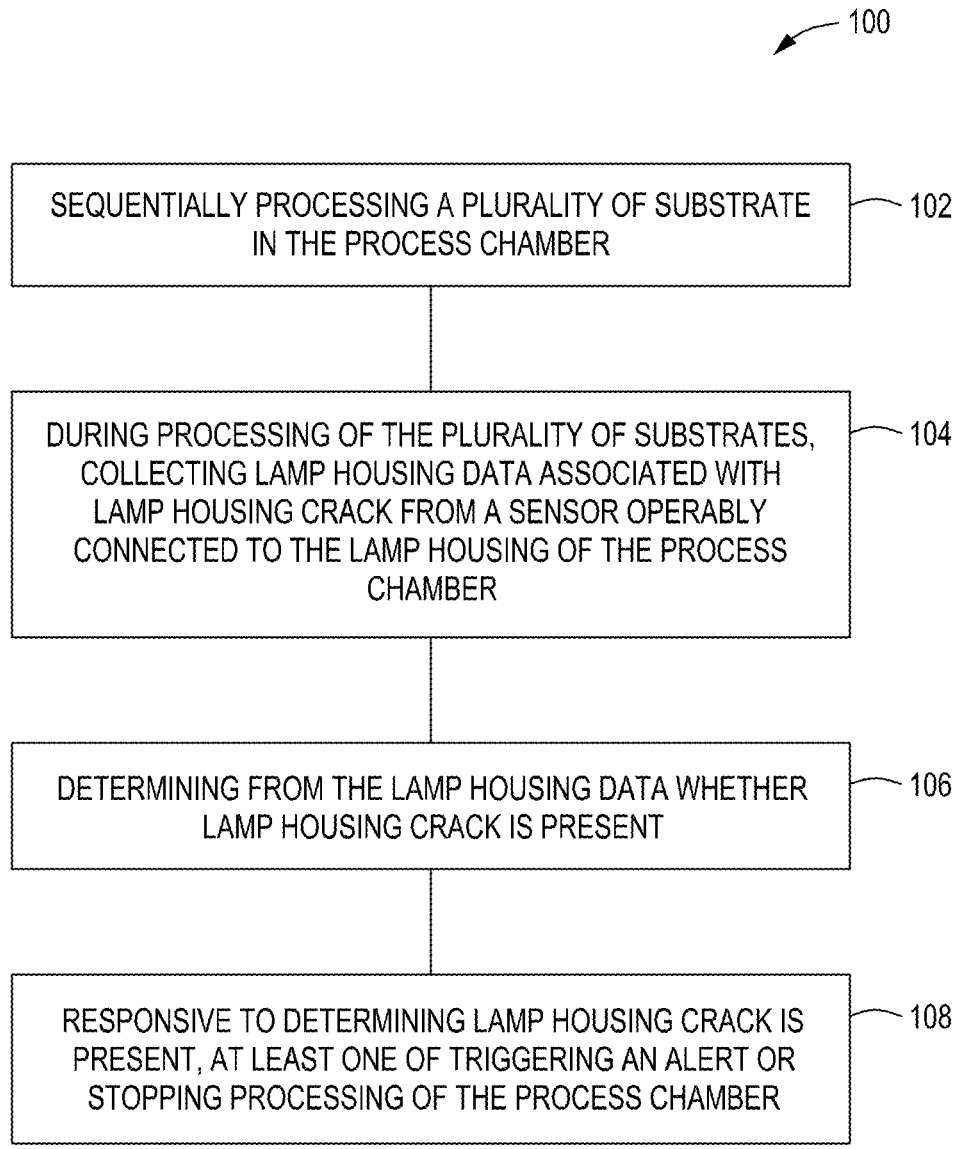
FIG. 1 is a flowchart of a method associated with a process chamber having a lamp housing, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus described herein are configured for use with a process chamber configured for processing of a substrate. For example, the process chamber can comprise one or more lamp housing sensors that can be configured to detect a lamp housing pressure, e.g., when used in conjunction with a reduced pressure process chamber. In at least some embodiments, methods and apparatus described herein use one or more humidity sensors that can be configured to detect a relative humidity in the lamp housing, e.g., when used in conjunction with an atmospheric pressure process chamber. For example, in either embodiment, collected data from the one or more lamp housing sensors or the humidity sensors can be used to predict when a crack will develop/form on the lamp housing. For example, with respect to the one or more lamp housing sensors, the collected data allows a user to determine a lamp housing pressure shift which can be correlated to an early-stage crack. Similarly, with respect to the humidity sensor, the collected data allows a user to determine a lamp housing humidity shift which can be correlated to an early-stage crack. Automated time series modelling using a window based on at least one of a moving average of a range of the collected data, which is maximum minus a minimum, or a standard deviation of the range of the collected data can also be used to set limits on the collected data to alert a user of early-stage crack detection (e.g., fault vs. normal). The methods and apparatus described herein can decrease, if not eliminate, unscheduled downtime and the need for corrective maintenance to replace the lamp housing, clean a water leak, and address additional failures of the lamp housing (and/or lamp head) and/or related components from water intrusion.

Figure 2:
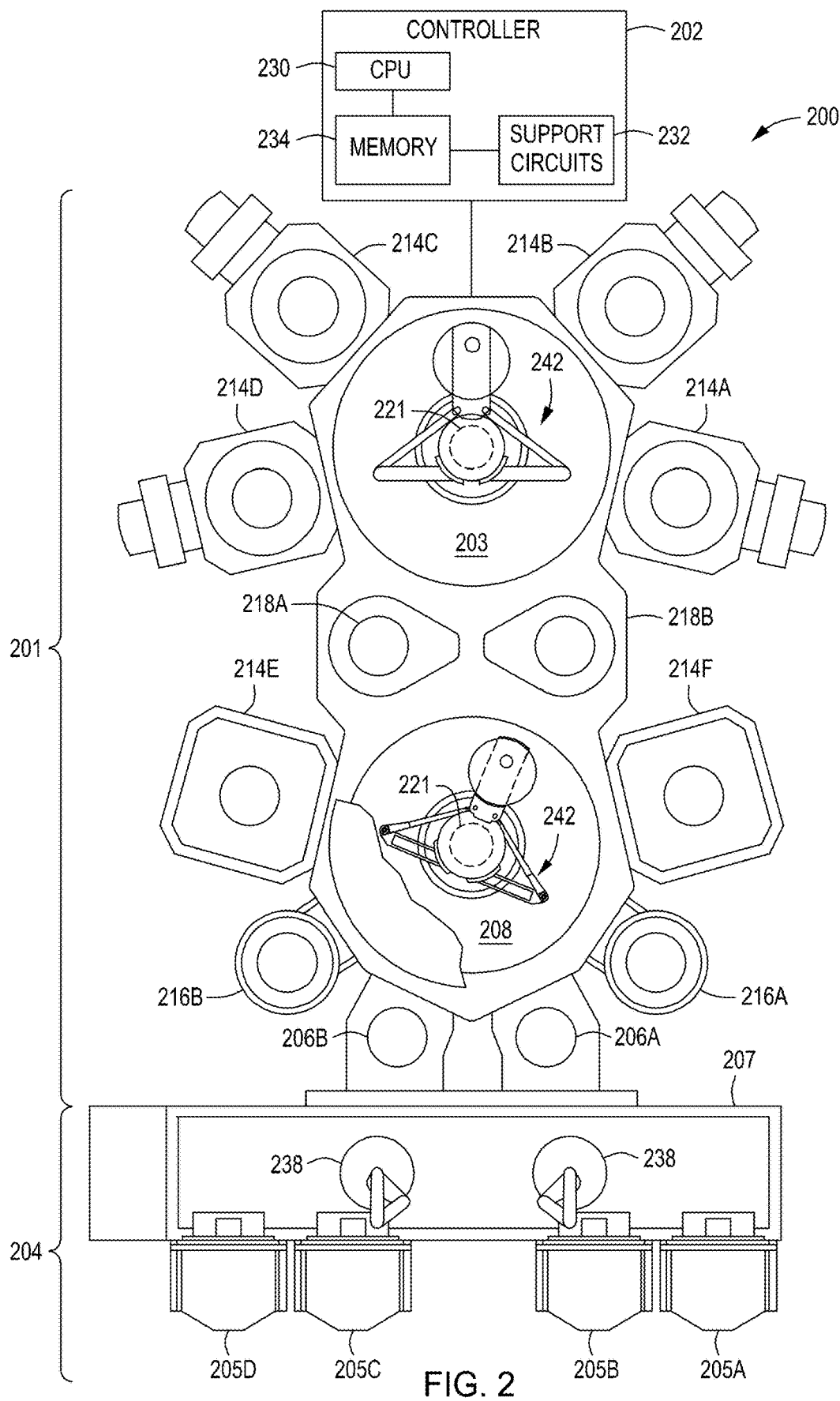
FIG. 2 is a tool configured for use for carrying out the method of FIG. 1, in accordance with at least some embodiments of the present disclosure.
Figure 3:
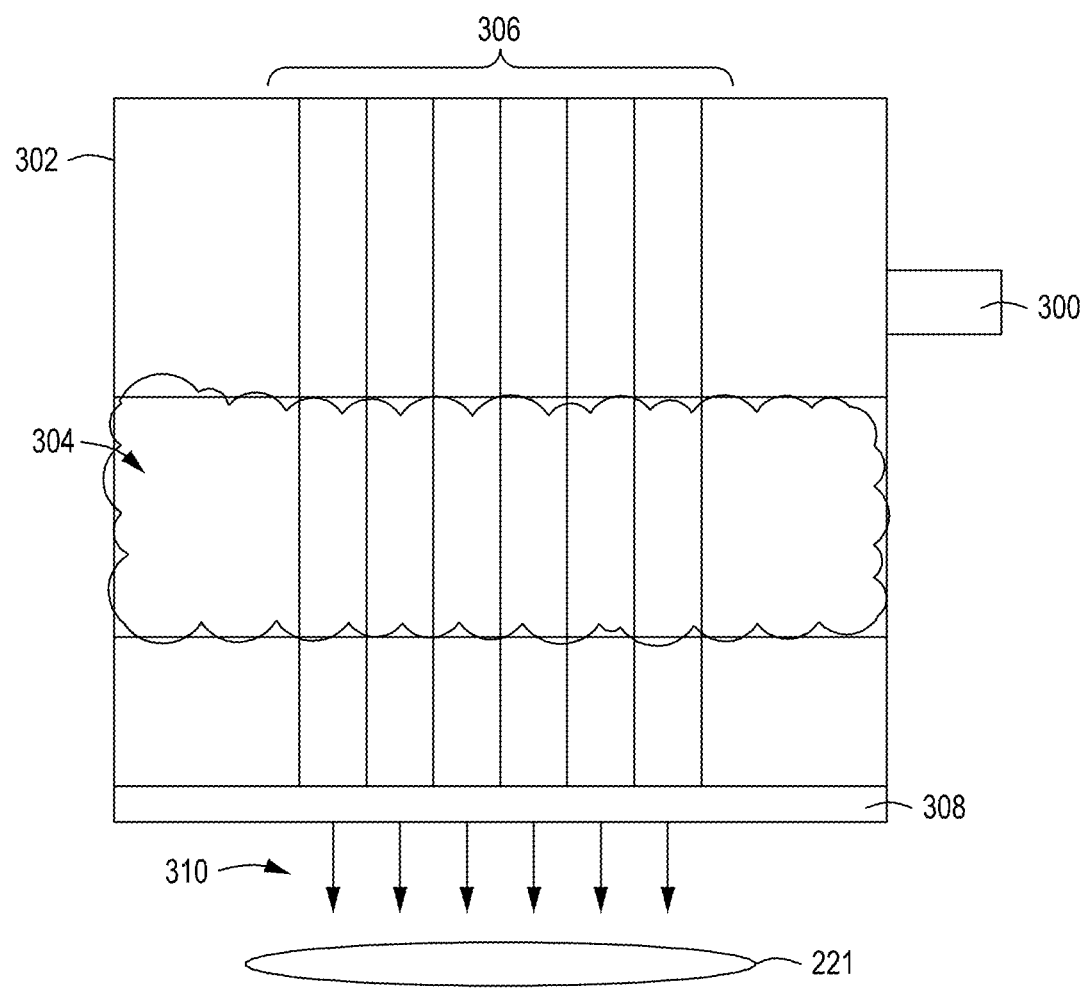
FIG. 3 is diagram of a lamp housing configured for use with the tool of FIG. 2, in accordance with at least some embodiments of the present disclosure.

FIG. 1 is a flowchart of a method 100 for processing a substrate, and FIG. 2 is a tool 200 (or apparatus) that can used for carrying out the method 100, in accordance with at least some embodiments of the present disclosure.

The method 100 may be performed in the tool 200 which can include any suitable process chambers configured for one or more of physical vapor deposition (PVD), chemical vapor deposition (CVD) and/or atomic layer deposition (ALD), such as plasma enhanced ALD or thermal ALD (e.g., no plasma formation). Examples of processing systems that may be used to perform the inventive methods disclosed herein may include, but are not limited to, the one or more process chambers commercially available from Applied Materials, Inc., of Santa Clara, California. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (the tool 200) described below with respect to FIG. 2. Examples of the integrated tool can include, but are not limited to, the one or more process chambers commercially available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of one or more metal layers or other portions of the substrate.

The integrated tool includes a processing platform 201 (vacuum-tight processing platform), a factory interface 204, and a controller 202. The processing platform 201 comprises multiple process chambers, such as 214A, 214B, 214C, and 214D operatively coupled to a transfer chamber 203 (vacuum substrate transfer chamber) and process chambers 214E and 214F operatively coupled to a buffer chamber 208 (vacuum substrate buffer chamber).

The factory interface 204 is operatively coupled to the buffer chamber 208 by one or more load lock chambers (two load lock chambers, such 206A and 206B shown in FIG. 2). In at least some embodiments, one of the buffer chamber 208 or the transfer chamber 203 of the tool 200 can omitted. One or more modules or channels can be provided between the buffer chamber 208 and the transfer chamber 203 and can be configured to receive one or more substrates from the buffer chamber 208 and/or the transfer chamber 203. In at least some embodiments, a module 218A and a module 218B are provided between the buffer chamber 208 and the transfer chamber 203 and are configured to receive one or more substrates from the buffer chamber 208 and/or the transfer chamber 203 during operation, as will be described in greater detail below. As noted above, the module 218A and a module 218B can have transparent cover.

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the buffer chamber 208 and the substantially ambient (e.g., atmospheric) environment of the factory interface 204. In at least some embodiments, the buffer chamber 208 can be maintained at a substantially ambient environment. In embodiments when the buffer chamber 208 is not used, the load lock chambers 206A and 206B facilitate passing the substrates between the transfer chamber 203 and the factory interface 204. The buffer chamber 208 and the transfer chamber 203 each have a vacuum robot 242 positioned to transfer/receive one or more substrates. For example, the vacuum robot 242 of the buffer chamber 208 is capable of receiving/transferring the substrates 221 between the load lock chambers 206A and 206B, the process chambers 214E and 214F, and the modules 218A and 218F. Similarly, the vacuum robot 242 of the transfer chamber 203 is capable of receiving/transferring the substrates 221 between the process chambers 214A, 214B, 214C, and 214D and the modules 218A and 218F.

In some embodiments, the process chambers 214A, 214B, 214C, 214D, 214E, and 214F can comprise at least an ALD chamber, a CVD chamber, a PVD chamber, an e-beam deposition chamber, and/or an electroplating, electroless (EEP) deposition chamber. Likewise, in some embodiments, one or more optional service chambers (shown as 216A and 216B) may be coupled to the buffer chamber 208. The service chambers 216A and 216B may be configured to perform other substrate processes, such as degassing, bonding, chemical mechanical polishing (CMP), annealing, substrate cleaning (e.g., preclean to remove oxidation), wafer cleaving, etching, plasma dicing, orientation, substrate metrology, cool down, and the like.

The controller 202 controls the operation of the tool 200 using a direct control of the process chambers 214A, 214B, 214C, 214D, 214E, and 214F, and the apparatus 212, or alternatively, by controlling the computers (or controllers) associated with the process chambers 214A, 214B, 214C, 214D, 214E, and 214F, the apparatus 212, and the tool 200. In operation, the controller 202 enables data collection and feedback from the respective chambers and systems to optimize performance of the tool 200. For example, the controller 202 can receive data from one or more sensors operably coupled to the one or more of the process chambers 214A, 214B, 214C, 214D, 214E, and 214F, the service chambers 216A and 216B, and/or the modules 218A and 218F. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage medium) and, when executed by the central processing unit 230, transform the central processing unit 230 into a specific purpose computer (e.g., the controller 202). The software routines may also be stored and/or executed by a second controller (not shown) that is located remotely from the tool 200.

Continuing with reference to FIG. 1, initially one or more substrates, thermal modular assembly, or the like may be loaded into one or more of the Four FOUPS, such as 205A, 205B, 205C, and 205D (FIG. 2). For example, in at least some embodiments, a substrate 221 (wafer) can be loaded into FOUP 205B. The substrate 221 can have a diameter of 150 mm, 200 mm, 300 mm, etc. The substrate 221 can be formed from germanium, silicon, silicon carbide, silicon oxide, etc. In at least some embodiments, the substrate 221 can have a 300 mm diameter and can formed from silicon. In at least some embodiments, one or more metal layers can be deposited on the substrate 221. For example, the one or more metal layers can comprise aluminum, cobalt, copper, nitride, titanium, tantalum, etc. In at least some embodiments, the substrate 221 can comprise a metal layer comprising cobalt and tungsten.

Once loaded, the factory interface robot 238 can transfer the substrate 221 from the factory interface 204 to the processing platform 201 through, for example, the load lock chamber 206A. The vacuum robot 242 of the buffer chamber 208 can transfer the substrate 221 from the load lock chamber 206A to and from one or more of the process chambers 214A, 214B, 214C, 214D, 214E, and 214F the service chambers 216A and 216B and/or the modules 218A and 218B.

For example, in at least some embodiments, the vacuum robot 242 of the buffer chamber 208 can transfer the substrate 221 from the load lock chamber 206A to the service chambers 216A and 216B and/or the modules 218A and 218B where one or more of degassing, bonding, chemical mechanical polishing (CMP), annealing, substrate cleaning (oxidation removal process), wafer cleaving, etching, plasma dicing, orientation, substrate metrology, and/or cool down can be performed.

For example, as noted above, the substrate 221 can be processed in one or more process chambers that are configured to use radiant heat provided by a lamp housing for processing a substrate. For example, the service chambers 216A and 216B (e.g., radiance chamber) can be configured to perform an anneal process (an anneal chamber) or oxidation removal process (an oxidation chamber), each of which use relatively high heat. When performing such processes, the service chambers 216A and 216B can be equipped with one or more sensors 300 (e.g., a lamp housing sensor and/or a relative humidity sensor) that are operably coupled, via one or more suitable coupling devices (e.g., bolts, clamps, etc.), to a lamp housing. For example, when the service chambers 216A and 216B are configured for use in a reduced pressure environment (e.g., an anneal process), the one or more sensors 300 can be configured to detect a lamp housing pressure (e.g., a pressure sensor). Similarly, when the service chambers 216A and 216B are configured for use in an atmospheric pressure environment (e.g., an oxidation removal process), the one or more sensors 300 can be configured to detect a relative humidity in a lamp housing (e.g., a relative humidity sensor). In either embodiment, collected data from the one or more sensors 300 can be used to predict when lamp housing crack will develop/form. Lamp housing crack can cause coolant 304 (e.g., water, chilled or not, from a cooling water line, not shown) to leak from the lamp housing 302 to one or more lamp modules 306, which are configured to emit/radiate high heat (e.g., illustrated by arrows 310) via a lamp window 308 to process the substrate 221. The leaked coolant 304 can damage, if not destroy, the one or more lamp modules 306, which can cause unscheduled down time, labor hours, and possibly other related component failures.

Accordingly, the inventors have found that by using empirical data relating to pressure and/or relative humidity obtained during one or more anneal processes or oxidation removal processes, respectively, lamp housing crack can be determined/predicted, and the damage caused therefrom can be reduced, if not eliminated. The empirical data can be obtained over an extended period of time (e.g., one week, two, week, one month, two month, one year, two year, etc.). For example, with respect to reduced pressure environments, the inventors have found that the collected data allows a user to determine a lamp housing pressure shift which can be correlated to an early-stage lamp housing crack. Similarly, with respect to atmospheric pressure environments, the inventors have found that the collected data allows a user to determine the lamp housing humidity shift which can be correlated to an early-stage housing crack. In at least some embodiments, automated time series modelling using a window based on at least one of a moving average of a range of the collected data, which is maximum minus a minimum, or a standard deviation of the range of the collected data can also be used to set limits on the collected data to alert a user of early-stage crack detection (e.g., fault vs. normal).

Accordingly, at 102, the method 100 comprises sequentially processing a plurality of substrates in a process chamber, and at 104, the method 100 comprises during processing of the plurality of substrates, collecting lamp housing data indicative of a fluid leak (which can cause lamp housing crack) in the lamp housing from a sensor operably connected to the lamp housing of the process chamber. For example, the automated time series modelling can comprise one or more of the following: a) collecting data for multiple substrates (wafer) runs (annealing and/or oxidation removal processes), b) for each substrate run, a range is computed (e.g., a range can be defined as a maximum minus a minimum sensor value (e.g., obtained from the one or more sensors 300 for that substrate run, c) computing a moving average of the ranges obtained from b), e.g., a moving average can be based on last X number of runs, d) computing a standard deviation of the ranges obtained from the second step, e.g., the standard deviation can be based on last X number of runs, e) computing a threshold limit by adding the moving average obtained from step three to the standard deviations obtained from the fourth step, and f) for the next substrate run, computing the range and comparing the computed range to the threshold limit obtained from e).

Next, at 106, the method 100 comprises determining from the lamp housing data whether lamp housing crack is present. For example, as noted above, the substrate 221, under the control of the controller 202, can be transferred to one or both of the service chambers 216A and 216B. For example, in at least some embodiments, the substrate 221 can be transferred to the service chamber 216A where an oxidation removal process can be performed on the substrate 221. Alternatively or additionally, the substrate 221 can be transferred to the service chamber 216B where an annealing process can be performed on the substrate 221.

During 106, the method 100 can comprise comparing a first subset of the lamp housing data collected while processing first substrates of the plurality of substrates (e.g., the empirical data collected during 102 and 104 at a) to e)) to a second subset of the lamp housing data collected while processing a second substrate of the plurality of substrates (e.g., 104 at f)). In at least some embodiments, during 106 the method 100 can comprise determining a threshold limit based on the first subset of the lamp housing data (e.g., obtained during 104 at e)), generating a metric based on the second subset of the lamp housing data and comparing the metric to the threshold limit (e.g., obtained during 104 at f)).

For example, while performing the oxidation removal process, the one or more sensors 300 (e.g., relative humidity sensor) collects relative humidity data of the lamp housing 302 and transmits the relative humidity data to the controller 202. Similarly, while performing the annealing process, the one or more sensors 300 (e.g., pressure sensor) collects pressure data (e.g., pressure shift along a surface of the lamp housing 302) of the lamp housing 302 and transmits the lamp housing pressure data to the controller 202.

For example, the controller 202 can compare the collected lamp housing data with the previously stored lamp housing data (e.g., the empirical data obtained from previously performed annealing processes and/or oxidation removal processes during 102 and 104 a) to e)). The empirical data can be obtained using time series modeling over a fixed time period of about 1 week to about 2 weeks, or in some embodiments, less than a week or longer than 2 weeks (e.g., 1 day to about 2 years). In at least some embodiments, the time period may not be fixed and the data can be collected using a continuous time series modelling. In at least some embodiments, the controller 202 can be configured to make the comparison at predetermined time intervals (e.g., a predetermined number of seconds, minutes, hours, etc.) or continuously during processing.

Next, at 108, the method 100 comprises responsive to determining lamp housing crack is present, at least one of triggering an alert or stopping processing of the process chamber. For example, when performing the oxidation removal process, if the relative humidity of the lamp housing 302 goes above a predetermined threshold (e.g., about 50% humidity to about 60% humidity) then the controller 202 can trigger an alert and/or automatically stop processing of the substrate. In at least some embodiments, the controller 202 can trigger an alert and a user can manually stop processing of the substrate. In at least some embodiments, the controller 202 can further be configured to detect a time frame at which the relative humidity remains at the predetermined threshold (e.g., for at least processing of one substrate). Similarly, when performing the annealing process, if the pressure of the lamp housing 302 goes above a predetermined threshold (e.g., about 20 Torrs to about 30 Torrs) then the controller 202 can trigger an alert and/or stop processing of the substrate. In at least some embodiments, the controller 202 can further be configured to detect a time frame at which the pressure remains at the predetermined threshold (e.g., for at least one substrate). In at least some embodiments, for a specific substrate, the predetermined threshold for relative humidity and pressure can be based on at least one on at least one of a moving average of a range of the collected data, which is maximum minus a minimum, or a standard deviation of the range of the collected data of the collected data obtained during the respective time series modeling over the time period (e.g., a time period of about 1 week to about 2 weeks, or in some embodiments, less than a week or longer than 2 weeks).

The method 100 comprising operations 102-108 can also be used in conjunction with the process chambers 214A, 214B, 214C, 214D, 214E, and 214F, if the process chambers 214A, 214B, 214C, 214D, 214E, and 214F were configured to perform one or more of the anneal processes or the oxidation removal processes.

Moreover, in some embodiments, the method 100 can be based on a prediction of a machine learning process/artificial intelligence process, which can predict, based on a trend of previous and current pressure/humidity measurements, when lamp house cracking can occur. For example, collected lamp data can be input into a trained machine learning model (e.g., which can be stored in the memory 234) that was previously trained from old data, and the output of the trained machine learning model can be used to trigger an alert as described above. For example, in at least some embodiments, during 106 the method 100 can comprise extracting one or more features from time-series lamp housing data and providing the one or more features to a trained neural network configured for providing an output indicating whether lamp housing crack is present. In a least some embodiments, the one or more features can comprise a maximum minus a minimum range for a sensor value obtained during substrate processing, as described above during 102 and 104 at a) to f). For example, collected data obtained can be input to the trained neural network and using the moving average and/or the standard deviation the trained neural network can determine a predetermined threshold (e.g., pressure/humidity) and trigger an alert when the predetermined threshold is met.

While the foregoing is directed to embodiments of the present disclosure, other and further embodiments of the disclosure may be devised without departing from the basic scope thereof.

The invention claimed is:

1. A method associated with a process chamber having a lamp housing, the method comprising:
  sequentially processing a plurality of substrates in the process chamber;
  during processing of the plurality of substrates, collecting lamp housing data indicative of a fluid leak in the lamp housing from a sensor, wherein the sensor is a pressure sensor configured to detect pressure along a surface of the lamp housing or a humidity sensor configured to detect relative humidity associated with the lamp housing, wherein the lamp housing includes a channel for flow of the fluid through the lamp housing;
  determining from the lamp housing data, independent of a lamp module housed in the lamp housing, whether a lamp housing crack is present; and
  responsive to determining the lamp housing crack is present, at least one of triggering an alert or stopping processing of the process chamber.

2. The method of claim 1, wherein determining whether the lamp housing crack is present comprises:
  comparing a first subset of the lamp housing data collected while processing first substrates of the plurality of substrates to a second subset of the lamp housing data collected while processing a second substrate of the plurality of substrates.

3. The method of claim 2, wherein the comparing comprises:
  determining a threshold limit based on the first subset of the lamp housing data;
  generating a metric based on the second subset of the lamp housing data; and
  comparing the metric to the threshold limit.

4. The method of claim 1, wherein determining whether the lamp housing crack is present comprises:
  extracting one or more features from the lamp housing data; and
  providing the one or more features to a trained neural network, the trained neural network providing an output indicating whether the lamp housing crack is present.

5. The method of claim 4, wherein the one or more features comprises a maximum minus a minimum range for a sensor value obtained during substrate processing.

6. The method of claim 1, wherein the process chamber is a reduced pressure chamber.

7. The method of claim 1, wherein the process chamber is an atmospheric chamber.

8. The method of claim 1, wherein the process chamber is at least one of an anneal chamber or an oxidation chamber.

9. The method of claim 1, wherein the pressure sensor is configured to detect a pressure shift along the surface of the lamp housing.

10. A non-transitory computer readable storage medium having instructions stored thereon that when executed by a processor cause a method associated with a process chamber having a lamp housing, the method comprising:
sequentially processing a plurality of substrates in the process chamber;
during processing of the plurality of substrates, collecting lamp housing data indicative of a fluid leak in the lamp housing from a sensor, wherein the sensor is a pressure sensor configured to detect pressure along a surface of the lamp housing or a humidity sensor configured to detect relative humidity associated with the lamp housing, wherein the lamp housing includes a channel for flow of the fluid through the lamp housing;
determining from the lamp housing data, independent of a lamp module housed in the lamp housing, whether lamp housing crack is present; and
responsive to determining lamp housing crack is present, at least one of triggering an alert or stopping processing of the process chamber.

11. The non-transitory computer readable storage medium of claim 10, wherein determining whether lamp housing crack is present comprises:
comparing a first subset of the lamp housing data collected while processing first substrates of the plurality of substrates to a second subset of the lamp housing data collected while processing a second substrate of the plurality of substrates.

12. The non-transitory computer readable storage medium of claim 11, determining a threshold limit based on the first subset of the lamp housing data;
generating a metric based on the second subset of the lamp housing data; and comparing the metric to the threshold limit.

13. The non-transitory computer readable storage medium of claim 10, wherein determining whether lamp housing crack is present comprises:
extracting one or more features from time-series lamp housing data; and providing the one or more features to a trained neural network, the trained neural network providing an output indicating whether lamp housing crack is present.

14. The non-transitory computer readable storage medium of claim 13, wherein the one or more features comprises a maximum minus a minimum range for a sensor value obtained during substrate processing.

15. The non-transitory computer readable storage medium of claim 10, wherein the process chamber is a reduced pressure chamber.

16. The non-transitory computer readable storage medium of claim 10, wherein the process chamber is an atmospheric chamber.

17. The non-transitory computer readable storage medium of claim 10, wherein the process chamber is at least one of an anneal chamber or an oxidation chamber.

18. The non-transitory computer readable storage medium of claim 10, wherein the pressure sensor is configured to detect a pressure shift along the surface of the lamp housing.

19. An apparatus for processing a substrate, comprising:
a process chamber configured to use radiant heat provided by a lamp housing for processing a substrate;
a sensor operably connected to the lamp housing, wherein the sensor is a pressure sensor configured to detect pressure along a surface of the lamp housing or a humidity sensor configured to detect relative humidity associated with the lamp housing; and
a controller configured to:
sequentially process a plurality of substrates in the process chamber;
during processing of the plurality of substrates, collect lamp housing data indicative of a fluid leak in the lamp housing from the sensor, wherein the lamp housing includes a channel for flow of the fluid through the lamp housing;
determine from the lamp housing data, independent of a lamp module housed in the lamp housing, whether lamp housing crack is present; and
responsive to determining lamp housing crack is present, at least one of trigger an alert or stop processing of the process chamber.

20. The process chamber of claim 19, wherein the controller is further configured to compare a first subset of the lamp housing data collected while processing first substrates of the plurality of substrates to a second subset of the lamp housing data collected while processing a second substrate of the plurality of substrates.

* * * * *